(12) United States Patent  
Shapira

(10) Patent No.: US 9,524,794 B1  
(45) Date of Patent: Dec. 20, 2016

(54) CONSTRAINED DATA SHAPING

(71) Applicant: SANDISK TECHNOLOGIES INC., Plano, TX (US)

(72) Inventor: Ofer Shapira, Herzliya (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/822,450

(22) Filed: Aug. 10, 2015

(51) Int. Cl.
*G11C 16/02* (2006.01)
*G11C 16/34* (2006.01)
*G06F 12/02* (2006.01)

(52) U.S. Cl.
CPC ....... *G11C 16/3495* (2013.01); *G06F 12/0246* (2013.01); *G06F 2212/7209* (2013.01); *G06F 2212/7211* (2013.01)

(58) Field of Classification Search
CPC .......................... G11C 16/3495; G06F 12/0246
USPC ............. 711/103, 154, 156, 221; 365/185.33
See application file for complete search history.

(56) References Cited

U.S. PATENT DOCUMENTS

| | | | | |
|---|---|---|---|---|
| 5,237,589 A * | 8/1993 | Hayakawa | ............ | H04L 25/062 327/31 |
| 5,493,296 A * | 2/1996 | Sugihara | .......... | G11B 20/10527 341/200 |
| 6,278,357 B1 * | 8/2001 | Croushore | ............... | H04B 3/54 340/534 |
| 8,022,850 B2 * | 9/2011 | Newman | ............ | H03M 1/0665 341/143 |
| 8,127,200 B2 | 2/2012 | Sharon et al. | | |
| 8,666,068 B2 | 3/2014 | Sharon et al. | | |
| 8,751,904 B2 | 6/2014 | Wang et al. | | |
| 8,799,559 B2 | 8/2014 | Sharon et al. | | |
| 8,799,593 B2 | 8/2014 | Chung et al. | | |
| 9,032,269 B2 * | 5/2015 | Sharon | ................ | G06F 11/1072 365/185.33 |
| 9,135,155 B2 * | 9/2015 | Sharon | ................ | G06F 11/1012 |
| 9,165,649 B2 * | 10/2015 | Sharon | ............... | G11C 14/0045 |
| 9,274,721 B2 * | 3/2016 | Oh | ........................ | G06F 3/0655 |
| 2004/0062362 A1 * | 4/2004 | Matsuya | ............. | H04L 25/4906 379/56.1 |
| 2014/0157086 A1 | 6/2014 | Sharon et al. | | |
| 2015/0294730 A1 * | 10/2015 | Lee | ........................ | G11C 16/32 365/185.18 |
| 2015/0324148 A1 * | 11/2015 | Achtenberg | ........ | G06F 11/1012 711/103 |
| 2016/0133324 A1 * | 5/2016 | Alrod | ................. | G11C 13/0097 365/148 |

* cited by examiner

*Primary Examiner* — Stephen Elmore
(74) *Attorney, Agent, or Firm* — Toler Law Group, PC

(57) ABSTRACT

A device includes a non-volatile memory and a controller coupled to the non-volatile memory. The controller is configured to determine a first shaping level corresponding to applying a first shaping operation to data to be stored to the non-volatile memory. The controller is further configured to, in response to the first shaping level exceeding a threshold, perform a second shaping operation to generate shaped data that corresponds to the data, the shaped data having a second shaping level that is less than the threshold.

21 Claims, 8 Drawing Sheets

CONSTRAINED DATA SHAPING

FIELD OF THE DISCLOSURE

This disclosure is generally related to data shaping.

BACKGROUND

Repeatedly storing data in a memory, such as a flash memory, may cause wearing of the memory which may reduce data retention capability and performance of the memory. For example, changing threshold voltages of memory cells during programming of the memory cells may cause noise, data retention disturbances (e.g., program disturbs) or cross coupling effects. As another example, programming memory cells of a non-volatile memory to have a high threshold voltage may cause faster wearing of the memory cells as compared to programming the memory cells to a lower threshold voltage or retaining the cells in an erased state. Data may be encoded prior to storage to generate encoded data that causes less memory wear. For example, the encoded data may use a greater proportion of data values that are represented using low threshold voltages and a lesser portion of data values that are stored using high threshold voltages. Data encoding may be used to enhance memory endurance by means of "shaping" a distribution of input data bits. For example, input data may be shaped so that when the data is written to a portion of the memory, the portion of the memory has a particular ratio of logical ones to logical zeros. However, shaping all input data using the same shaping algorithm may result in a large variance of data programmed to the memory.

DETAILED DESCRIPTION

Figure 1:
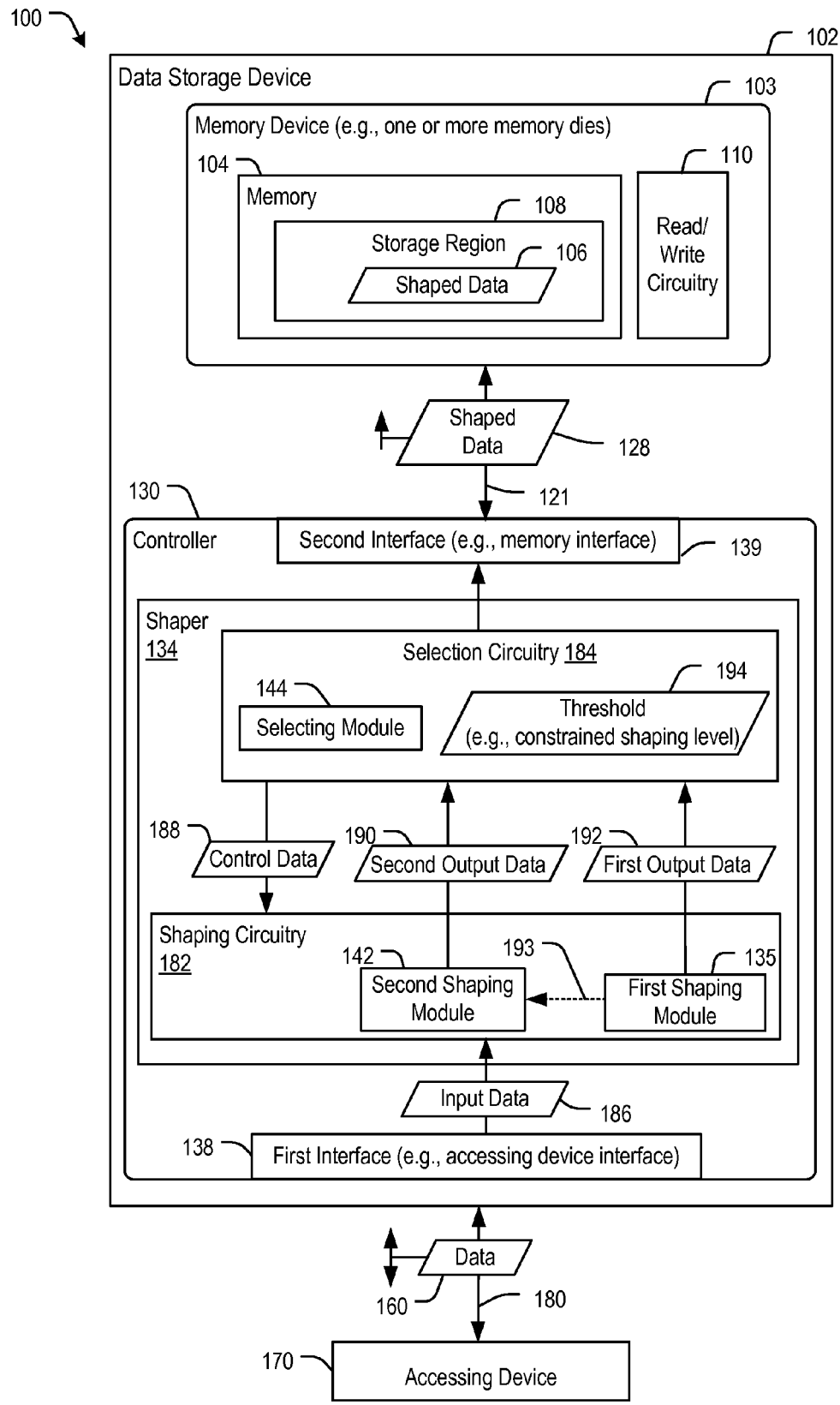
FIG. 1 is a block diagram of a particular illustrative example of a system including a data storage device having a controller configured to generate shaped data based on a constrained shaping level.

Particular aspects of the present disclosure are described below with reference to the drawings. In the description, common features are designated by common reference numbers. It is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited. As used herein, "exemplary" may indicate an example, an implementation, and/or an aspect, and should not be construed as limiting or as indicating a preference or a preferred example, implementation, and/or aspect.

Memories, such as flash memories, may have limited endurance to Write/Erase (W/E) cycles and may have limited data retention. As a number of W/E cycles performed in a memory increases, a data retention capability of the memory may be reduced and a possibility of failures may increase. A memory cell of the memory may be programmed based on data to be represented by the memory cell. The data to be represented by the memory cell may be referred to as a "logical state" of the memory cell. For example, the logical state may correspond to one or more data bits, such as one or more bit values. To illustrate, a memory cell that is programmed as a single level cell (SLC) may have a logical state of 1 or 0. A memory cell that is programmed as a multi-level cell (MLC) may have a logical state that is a combination of multiple data bits, such as two or more bit values. Each logical state may correspond to a different threshold voltage range. To program a memory cell, a threshold voltage of the memory cell may be changed from a first state (e.g., a low state) to a second state (e.g., a higher state). A transition of the memory cell from the low state to the higher state may cause a current through an oxide isolation layer of the memory cell and may generate electron trap sites. A failure of the memory cell may manifest as a failure to erase or program a block that includes the memory cell or as reduced data retention ability of the memory cell, as illustrative examples.

An endurance of a memory may be judged based on an ability to maintain data at the memory, retrieve data from the memory, and perform error correction on the retrieved data to generate corrected data. In some memory fabrication processes, as a cell's dimensions shrink, W/E cycling endurance may be reduced and may become a limiting factor that may affect commercial viability of the memory. Moreover, in some cases there may be special blocks of the memory, such as blocks used by management software (e.g., flash management software) or blocks used for binary caching, that experience more W/E cycles than the rest of the memory and that may be affected by W/E cycle endurance of the memory.

One or more options (e.g., techniques) may be implemented to increase a number of W/E cycles that may be performed at a memory prior to an end of a useful life of memory. A first option may be to program memory cells to have a similar threshold voltage as neighbor cells to reduce cross coupling between cells. For example, a large voltage difference between two cells may lead to a change in the threshold voltage of both cells due to the mutual effect of the electrical cross coupling between the cells. In addition, a high electric field formed between these cells may increase electron movement, thus changing the net charge in these cells and/or other neighboring cells. A second option may be to manipulate data bits (e.g., a logical state) to be programmed to a cell, which may affect the threshold voltage of the cell. For example, the data bits may be manipulated so that programming a group of cells limits a number of cells that transition from a low state to a high state. By limiting the number of cells that transition from the low state to the high state, current through the oxide isolation layer may be reduced and, thus, wear on the group of cells may be reduced.

When the second option is used, data may be manipulated during a data encoding stage, referred to as "shaping", to enhance the memory endurance. The term shaping stems from the fact that practical schemes choose the data transformation step to yield a new sequence with some desired properties on the distribution of the input data bits, hence "shaping" that distribution. It is noted that a shaping operation is reversible to enable the original data to be recovered from manipulated data. As an example of a first shaping technique, in an SLC memory, a logical 1 may correspond to a low threshold voltage state (e.g., an erase state) and a logical 0 may correspond to a high threshold voltage state. When a cell is in an erased state (e.g., a low threshold voltage state) and a logical 1 value is to be programmed to the cell, no transition in the cell's state is required (e.g., the cell remains in the low threshold voltage state). Thus, a shaping technique applied to transform (e.g., manipulate) data may be designed to increase the 1's proportion over the 0's proportion for any given sequence of data. If a cell can be maintained in a low voltage state, an overall current through the cell's oxide isolation layer may be reduced and an endurance of the cell may be increased.

A second shaping technique other than increasing the 1's proportion over the 0's proportion may consider locations of cells within a memory when choosing state values for the cells. For example, such a shaping technique may shape data so that neighboring cells are programmed to similar threshold voltages, such that a reduced number of cells having a low voltage state neighbor cells having a high voltage state.

Regardless of whether the first or the second shaping technique is implemented, manipulating data bits may enable the threshold voltages (e.g., voltage states) of the cells to be controlled to reduce unwanted physical phenomenon, such as cross coupling effects, and to improve endurance.

An example of a shaping algorithm may be a greedy shaping algorithm, such as an adaptive generalized bit flip (AGBF) algorithm. The greedy shaping algorithm may be configured to improve (or optimize), such as maximize or minimize, some measure or criteria. For example, the greedy shaping algorithm may be configured to increase a number of cells that may be programmed to a low voltage state. To illustrate, when data is to be stored at SLC memory cells, the greedy shaping algorithm may be configured to increase a number of bits of data having a bit value of 1 (corresponding to a low threshold voltage state). Using the greedy shaping algorithm, highly shapeable data input may be highly shaped, and data which originated from random input data may be completely unshaped. The large variance of shaping may complicate memory management, such as by increasing a number of parameter sets (e.g., reading parameters and writing parameters) to be tracked for the memory and increasing memory management overhead.

To illustrate, a data storage device may track (e.g., generate and store) parameters, such as reading and writing parameters, for different portions of a memory. A set of parameters (e.g., reading parameters and/or writing parameters) for a particular portion of the memory may include, but is not limited to, a number of writing pulses, a write voltage, a read voltage threshold voltages for detecting logical states, etc. Shaping may cause a particular threshold voltage distribution and read sense values and the reading parameters may be generated to target transition points between a voltage range (e.g., a logical state population) and a neighboring voltage range (e.g., another logical state population). Additionally or alternatively, shaping may cause a specific sequence of programming patterns to the same location of the memory from which the writing parameters may be determined. Multiple sets of parameters may be maintained in a data structure, such as a time tagging table, that indicates which portion(s) of the memory correspond to which set of parameters.

As a memory is used over time, new sets of parameters may be generated and stored in the time tagging table. For example, different sets of parameters are generated and used as the memory is programmed, erased, and reprogrammed over time. Additionally, new sets of parameters may be generated based on the nature of the data written to the memory. For example, different sets of parameters may be generated to account for highly variant data, such as different sets of data that have different shaping levels. Accordingly, an increase in the number of different shaping levels used to store data corresponds to an increase in the size of the time tagging table (e.g., more sets of parameters are generated and stored in the time tagging table). By reducing the variance in the data, such as by reducing a range of shaping levels, that can be programmed into the memory, the systems and methods of the present disclosure reduce the total size of the time tagging table maintained for the memory, thereby reducing memory management overhead. To illustrate, a larger time tagging table may be maintained when the data varies between 50%-90% logical ones than when the data varies from 50%-70% logical ones.

The present disclosure describes systems and methods for shaping data. For example, a controller of a data storage device may receive data to be stored at a non-volatile memory, such as a flash memory, of the data storage device. The data may include multiple data bits and the controller may be configured to generate shaped data, according to one or more criteria. For example, shaping may favor slow transitions between threshold voltages of neighboring cells such that a reduced number of cells having a low voltage state neighbor cells having a high voltage state. As another example, shaping may transform the data to favor cells being programmed to a low voltage state. In implementations where the shaping favors cells being programmed to a low voltage state, an amount of current (e.g., a number of electrons) through a cell's oxide isolation layer may be reduced. To illustrate, the controller may shape the data to be stored at SLC cells to favor logical 1's over logical 0's.

The controller may also be configured to apply a shaping constraint to the shaped data. In some implementations, the constraint may be applied such that all states have a minimal frequency in a cell voltage distribution, thus limiting the variance of read thresholds for different word lines and limiting the size of the time tagging table. The constraint may be an upper limit on the number of 1's for data to be stored at SLC cells.

In some implementations, the controller may consider a number of logical 1's when shaping the data and when applying the constraint to the shaped data. To illustrate, the controller may generate shaped data to have a maximum number of logical 1's and may constrain the shaped data to generate constrained shaped data that has a number of logical 1's that is less than the shaping constraint.

For example, the controller may be configured to determine a first shaping level corresponding to applying a first shaping operation to data to be stored to the non-volatile memory. To illustrate, the controller may use a greedy shaping algorithm and the first shaping level may be dynamic (e.g., the first shaping level may be different for different input data). The controller may be further configured to, in response to the first shaping level exceeding a threshold, perform a second shaping operation to generate constrained shaped data that corresponds to the data. The constrained shaped data may have a second shaping level that is static in nature (e.g., equal to or less than the threshold). By generating shaped data to have a shaping level that is less than the threshold, variations between data stored at the non-volatile memory may be reduced as compared to data storage devices that do not constrain shaping levels. Accordingly, by constraining shaping levels based on the threshold, fewer sets of parameters may be generated based on the nature (e.g., shaping level) of the data written to the non-volatile memory. By having fewer sets of parameters, a total size of the time tagging table maintained for the non-volatile memory may be reduced.

In some implementations, the threshold may include or correspond to a constrained shaping level (e.g., a threshold level or a threshold range). For example, the constrained shaping level may include or correspond to a threshold level, such as a threshold percentage or ratio of bits (e.g., 70%) having a logical one value (or a logical zero value) out of a total number of data bits. To illustrate, the threshold value may be used as an upper bound such that a percentage of logical ones of the shaped data bits is less than or equal to the threshold value (e.g., 70% logical ones). In some implementations, the threshold level may include or correspond to a ratio of logical ones to logical zeros (or a ratio of logical zeros to logical ones) in the shaped data bits. As another example, the constrained shaping level may include or correspond to a threshold range. To illustrate, the shaped data bits may have a percentage of logical ones within a threshold range, such as a threshold range of 50%-70% logical ones. The constrained shaping level (e.g., the threshold level and/or the threshold range) may be selected to increase endurance of the non-volatile memory while constraining the size of memory management table(s), such as time tagging table(s), maintained by the data storage device. For example, the constrained shaping level may be used to generate shaped data having a number of logical ones that does not exceed 70% of the shaped data.

FIG. 1 depicts an illustrative example of a system 100. The system 100 includes a data storage device 102 and an accessing device 170. The data storage device 102 includes a controller 130 and a memory device 103 that is coupled to the controller 130. The memory device 103 may include one or more memory dies.

The data storage device 102 and the accessing device 170 may be coupled via a connection (e.g., a communication path 180), such as a bus or a wireless connection. For example, the data storage device 102 may include a first interface 138 (e.g., an accessing device interface) that enables communication via the communication path 180 between the data storage device 102 and the accessing device 170.

In a particular embodiment, as further described herein, the controller 130 may include a shaper 134 that is configured to shape data bits in accordance with a constrained shaping level. For example, the shaper 134 may receive input data 186 from the accessing device 170 for storage in memory 104. In a particular non-limiting example in which the memory 104 corresponds to NAND flash memory, the shaper 134 may shape data bits to be stored in the NAND flash memory such that a ratio of logical ones to logical zeros in the shaped data bits falls within a threshold range (e.g., 50%-70% logical ones). The threshold range of logical ones may be selected to increase endurance of the NAND flash memory while maintaining small memory management table(s), such as time tagging table(s), as further described herein.

In some implementations, the controller 130 includes an error correction code (ECC) engine (not shown). The ECC engine may be configured to receive data, such as the shaped data 128, and to generate one or more error correction code (ECC) codewords (e.g., including a data portion and a parity portion) based on the data. For example, the ECC engine may receive shaped data 128 and may generate a codeword. To illustrate, the ECC engine may include an encoder configured to encode the data using an ECC encoding technique. The ECC engine may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples. In some implementations, the ECC engine may be configured to maintain or substantially maintain a shaping level of the shaped data 128.

In some implementations, the ECC engine may encode the user data 160 received from the accessing device 170 and provide the encoded data to the shaper 134. In other implementations, the shaper 134 may receive the user data 160 from the accessing device 170 and may generate the shaped data 128. The shaper 134 may provide the shaped data 128 to the ECC engine and the ECC engine may encode the shaped data 128 to generate encoded shaped data. The controller 130 may send the encoded shaped data to the memory device 103 to be stored at the memory 104.

The ECC engine may include a decoder configured to decode data read from the memory 104 to detect and correct bit errors that may be present in the data. For example, the ECC engine may correct a number of bit errors up to an error correction capability of an ECC technique used by the ECC engine. A number of errors identified by the ECC engine may be tracked by the controller 130.

In some implementations, the data storage device 102 may be embedded within the accessing device 170, such as in accordance with a Joint Electron Devices Engineering Council (JEDEC) Solid State Technology Association Universal Flash Storage (UFS) configuration. Alternatively, the data storage device 102 may be removable from the accessing device 170 (i.e., "removably" coupled to the accessing device 170). As an example, the data storage device 102 may be removably coupled to the accessing device 170 in accordance with a removable universal serial bus (USB) configuration. In some implementations, the data storage device 102 may include or correspond to a solid state drive (SSD) which may be included in, or distinct from (and accessible to), the accessing device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the accessing device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be configured to be coupled to the accessing device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the accessing device 170 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples. In some implementations, the data storage device 102 is coupled to the accessing device 170 indirectly, e.g., via a network. For example, the data storage device 102 may be a network-attached storage (NAS) device or a component (e.g., a solid-state drive (SSD) device) of a data center storage system, an enterprise storage system, or a storage area network.

The accessing device 170 may include a memory interface (not shown) and may be configured to communicate with the data storage device 102 via the memory interface to read data from and write data to the memory device 103 of the data storage device 102. For example, the accessing device 170 may operate in compliance with a Joint Electron Devices Engineering Council (JEDEC) industry specification, such as a Universal Flash Storage (UFS) Access Controller Interface specification. As other examples, the accessing device 170 may operate in compliance with one or more other specifications, such as a Secure Digital (SD) Access Controller specification, as an illustrative, non-limiting example. The accessing device 170 may communicate with the memory device 103 in accordance with any other suitable communication protocol.

The accessing device 170 may include a processor and a memory. The memory may be configured to store data and/or instructions that may be executable by the processor. The memory may be a single memory or may include multiple memories, such as one or more non-volatile memories, one or more volatile memories, or a combination thereof. The accessing device 170 may issue one or more commands to the data storage device 102, such as one or more requests to erase data, read data from, or write data to the memory device 103 of the data storage device 102. For example, the accessing device 170 may be configured to provide data, such as user data 160, to be stored at the memory device 103 or to request data to be read from the memory device 103. The accessing device 170 may correspond to a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The data storage device 102 may include a memory device 103. The memory device 103 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more regions, such as a representative storage region 108, of storage elements (also referred to herein as memory cells). An example of the storage region 108 may be a block, such as a NAND flash erase group of storage elements. Another example of a storage region 108 is a word line of storage elements. A word line may function as a single-level-cell (SLC) word line, as a multi-level-cell (MLC) word line, or as a tri-level-cell (TLC) word line, as illustrative, non-limiting examples. Each storage element of the memory 104 may be programmable to a state (e.g., a threshold voltage in a flash configuration or a resistive state in a resistive memory configuration) that indicates one or more values.

The memory 104 may include support circuitry, such as read/write circuitry 110, to support operation of one or more memory dies of the memory device 103. Although depicted as a single component, the read/write circuitry 110 may be divided into separate components of the memory 104, such as read circuitry and write circuitry. The read/write circuitry 110 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The controller 130 is coupled to the memory device 103 via a bus 121, an interface (e.g., interface circuitry, such as a second interface 139), another structure, or a combination thereof. For example, the bus 121 may include multiple distinct channels to enable the controller 130 to communicate with each of memory die of the memory device 103 in parallel with, and independently of, communication with other memory dies of the memory device 103. In some implementations, the memory 104 may be a flash memory, as an illustrative, non-limiting example.

The controller 130 is configured to receive data and instructions from the accessing device 170 and to send data to the accessing device 170. For example, the controller 130 may send data to the accessing device 170 via the first interface 138, and the controller 130 may receive data from the accessing device 170 via the first interface 138. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller 130 may also include the shaper 134. The shaper 134 may be configured to shape data bits in accordance with a constrained shaping level. In some implementations, the constrained shaping level may correspond to a highest allowed shaping level (i.e., not necessarily a highest achievable shaping level for received data). The shaper 134 may include shaping circuitry 182 and selection circuitry 184 (e.g., selection logic). Although the shaper 134 is illustrated as including the shaping circuitry 182 and the selection circuitry 184, in other implementations, the shaping circuitry 182 or the selection circuitry 184 may be external to the shaper 134.

The shaping circuitry 182 may include a first shaping module 135 and a second shaping module 142. The first shaping module 135 may be configured to perform a first shaping operation on the input data 186 to generate first output data 192. The first output data 192 may include a larger number of bits having a first bit value (e.g., a logical one value) than bits having a second bit value (e.g., a logical zero value). In some implementations, the first shaping operation may be configured to sequentially process bits of the input data 186 and to generate the first output data 192 by selectively changing a bit value of each particular bit of the input data 186 based on a count of processed bits that have a first particular bit value (e.g., a bit value of zero). For example, the first shaping operation may implement a greedy shaping algorithm, such as adaptive generalized bit flip (AGBF) algorithm, that is configured to maximize shaping of the input data 186 to improve endurance of the memory 104.

To illustrate, the first shaping operation that implements the greedy shaping algorithm may sequentially process each bit of the input data 186 and determine whether the bit is to be a logical one or a logical zero based on a number of logical zeros in one or more windows (including one or more bit values preceding the bit). In some implementations, multiple windows may be used to increase throughput using parallel processing (e.g., one window for each processing thread). The window may include all previously processed bits of the input data 186 or may include up to a certain number of most recently processed bits of the input data 186. If the window includes a number of logical zeros that is greater than or equal to a first threshold, such as 50% zeros, a particular value of the bit may be flipped. To illustrate, if a particular bit has a logical zero value and if a majority of bit values included in the window (prior to the particular bit and not including the particular bit) are logical zero, the value of the particular bit may be changed from logical zero to logical one (e.g., the particular bit may be "flipped"). In some implementations, the first output data 192 generated using the greedy shaping algorithm may have a percentage of logical ones that is greater than 70% logical ones. Although the first shaping operation has been described as implementing the greedy shaping algorithm (e.g., the AGBF algorithm), in other implementations, the first shaping operation may be configured to implement any other greedy shaping algorithm or a non-greedy shaping algorithm.

The second shaping module 142 may be configured to generate second output data 190. For example, the second shaping module 142 may perform a second shaping operation to generate the second output data 190. In some implementations, the first shaping module 135 and the second shaping module 142 may each implement the same type of shaping. For example, each of the first shaping module 135 and the second shaping module 142 may implement a greedy shaping algorithm. To illustrate, the first shaping module 135 may implement the AGBF algorithm and the second shaping module 142 may implement a greedy shaping algorithm other than the AGBF algorithm. In other implementations, the first shaping module 135 and the second shaping module 142 may implement different types of shaping. For example, the first shaping module 135 may implement a greedy shaping algorithm, such as the AGBF algorithm, and the second shaping module 142 may implement a non-greedy shaping algorithm. As an illustrative, non-limiting example, the first shaping module 135 may implement a greedy shaping algorithm, such as the AGBF algorithm, and the second shaping module 142 may perform shaping using a random number generator (RNG), as described further herein.

In a first illustrative implementation of the second shaping module 142, the second shaping module 142 may be configured to sequentially process bits of the first output data 192. For example, the second shaping module 142 may receive the first output data 192 from the first shaping module 135 as indicated by dashed line 193 and may sequentially process bits of the first output data 192 to generate the second output data 190. To illustrate, the second shaping operation may sequentially process the bits of the first output data and determine to flip a particular bit of the first output data if a window history prior to the particular bit indicates that the threshold 194 (e.g., a percentage of bits having a logical 1 value) is exceeded, as described further herein. Accordingly, the second shaping module 142 may generate the second output data 190 by selectively changing a bit value of each particular output bit in the first output data 192. For example, the second shaping operation may selectively change a bit value based on a count of processed first output data bits that have a second particular bit value (e.g., a bit value of one). When the data is read from the memory 104, the data may be "unshaped" using reverse operation(s) to recover the original input data.

The second shaping operation may sequentially process each bit of the first output data 192 and determine whether the bit is to be a logical one or a logical zero based on a number of logical ones in a window that includes one or more bits preceding bit values. The window may include all previously processed bits of the first output data 192 or may include up to a certain number of most recently processed bits of the first output data 192. If the window includes a number of logical ones that is greater than or equal to a second threshold, such as 70% ones, a particular value of the bit may be flipped. For example, if a particular bit has a logical one value and more than 70% of bit values included in the window are a logical one, the value of the particular bit may be changed from logical one to logical zero to generate the second output data 190. In some implementations, the second shaping module 142 may flip a bit if the number of logical ones in the window satisfies (e.g., is included in) a threshold range, such as 70%-90% logical ones. When the data is read from the memory 104, the data may be "unshaped" using reverse operation(s) to recover the original input data.

In a second illustrative implementation of the second shaping module 142, the second shaping module 142 may be configured to change bit values of the first output data 192 based on an output of a biased random number generator (not shown). The biased random number generator may be included in or coupled to the second shaping module 142. The biased random number generator may be configured to generate a random number that statistically includes a percentage of logical ones, such as 50%-70% logical ones.

In the second illustrative implementation, the controller 130 may include a random number generator (RNG) that is configured to generate a sequence of numbers with no apparent pattern, yet possesses some desired statistical properties. The RNG may include a linear feedback shift register (LFSR) that may be used to produce random binary sequences. The RNG (e.g., the LFSR) may be set to an initial value, generally referred to as a seed, and the RNG may produce the sequence values one by one, where each bit is determined as a function of the prior bits, hence giving an output of the LFSR a random appearance. A basic property of such an LFSR is that both bit values, i.e. zero and one, have approximately equal frequency of being output by the LFSR. A bias may be created toward one of the bit values, e.g. 60% 1's and 40% 0's, by adding a component to operate in conjunction with the LFSR. For example, if n bits (where n is a positive integer greater than 1) are to be produced with a distribution of 40% 0's and 60% 1's, a sequence produced by the LFSR may have a size N (where N is a positive integer having a value greater than n), and N-n bits may be discarded in random locations, where the bit value for that location was 0, and where (N-n) is about 10% of n. In some implementations, instead of choosing the locations at random, a distribution of bits may be monitored for the partial produced sequence. If the percentage of 1's is less than 60% by some threshold, then the additional component may discard the output (bit by bit) of the LFSR until it receives a bit of value 1. In this manner, the entire biased sequence of length n is still produced by a single seed value, although it may take more than n LFSR activations to produce the whole sequence.

A shaping operation may utilize a biased RNG to produce a sequence having a contrained shaping level. In one aspect, an XOR operation may be performed between a given sequence x and an auxiliary sequence y to produce a sequence z having a desired distribution. To illustrate, let p(x), p(y), p(z) be a percentage of 0's for the sequence x, y, z respectively. The following first equation links the three probability functions:

$$p(z)=p(x)p(y)+(1-p(x))(1-p(y)).$$

The first equation may be rewritten as a second equation:

$$p(y)=(p(z)+p(x)-1)/(2p(x)-1)$$

For the given sequence x, p(x) is derived from x, and p(z) may be treated as the desired distribution. Thus, if p(y) by the second equation exists (denominator is not 0 and the overall value is between 0 and 1), then an actual sequence z may be achieved with distribution p(z), by doing the XOR between x and the output of an RNG of bias p(y). Of course, a percentage of 0's of a finite sequence may vary from a theoretical value determined by p(z) as indicated in the above equations, since convergence in a distribution may be asymptotic. A variation of the percentage of 0's from a theoretical value determined by p(z) may be limited by using the RNG several times with different seed values and choosing an output that achieves the closest percentage to the theoretical value determined by p(z).

In some implementations, the random number generated by the biased random number generator may include the same number of bits as the input data 186. In some implementations, the second shaping operation may include generating the random number, and the second output data 190 may be set to the random number. In other implementations, the second shaping module 142 may receive the first output data 192 and the second shaping operation may include exclusive ORing (XORing) the first output data 192 and the random number to generate the second output data 190.

The selection circuitry 184 may be configured to select the first output data 192 or the second output data 190 to be stored in the memory 104 based on whether a first shaping level of the first output data 192 satisfies a threshold 194. The selection circuitry 184 includes a selecting module 144 and a threshold 194. The threshold 194 may be associated with a constrained shaping level. For example, the threshold 194 may include a threshold value or a threshold range associated with a percentage of logical ones or a ratio of logical ones to logical zeros in a number of bits. Although illustrated as being included in the selection circuitry 184, the threshold 194 may be external to the selection circuitry 184. For example, the threshold 194 may be included in a memory that is coupled to the selection circuitry 184. To illustrate, the memory may be included in the shaper 134, the controller 130, the memory device 103 (e.g., the memory 104), or the accessing device 170, as illustrative, non-limiting examples.

The selecting module 144 may be configured to determine a shaping level of output data, such as the first output data 192 and/or the second output data 190 received from the shaping circuitry. The shaping level may be associated with a count of bits of the output data having a particular value, such as a logical one value or a logical zero value, as compared to a total number of bits of the output data. In some implementations, the shaping level may be determined as a percentage of a total number of bits of the output data.

In other implementations, the shaping level may be determined as a ratio, such as a ratio of a number of bits (of the output data) having a logical one value to a second number of bits (of the output data) having a logical zero value. To illustrate, the selecting module 144 may determine a first shaping level of the first output data 192 as a percentage of bits (of the first output data 192) having a logical one value.

After determining the shaping level of output data, the selecting module 144 may compare the shaping level to the threshold 194. For example, the selecting module 144 may compare the first shaping level to the threshold 194. In some implementations, if the threshold 194 is associated with a threshold value (e.g., 70% logical ones), the selecting module 144 may compare the first shaping level to the threshold 194 to determine whether the first shaping level is greater than or equal to the threshold 194. In response to determining that the first shaping level is less than the threshold 194, the selecting module 144 may output the first output data 192 as the shaped data 128. Alternatively, in response to determining that the first shaping level is greater than or equal to the threshold 194, the selecting module 144 may initiate the second shaping module 142 to generate the second output data 190. For example, the selecting module 144 may send control data 188 to the shaping circuitry 182 to cause the second output data 190 to be generated. In some implementations, the control data 188 may include a control signal that causes the first shaping module 135 to provide the first output data 192 to the second shaping module 142. In other implementations, the control data 188 may include the first output data 192.

In a first illustrative implementation of the second shaping module 142, the second shaping module 142 may be configured to sequentially process bits of the first output data 192 and to generate the second output data 190 by selectively changing a bit value of one or more output bits in the first output data 192. In this implementation of the second shaping module 142, the selecting module 144 may be configured to receive the second output data 190 and to determine a second shaping level of the second output data 190. To illustrate, the selecting module 144 may compare the second shaping level to the threshold 194. In response to determining that the second shaping level is less than the threshold 194, the selecting module 144 may output the second output data 190 as the shaped data 128. Alternatively, in response to determining that the second shaping level is greater than or equal to the threshold 194, the selecting module 144 may initiate the second shaping module 142 to generate third output data (not shown) by sequentially processing bits of the second output data 190 in a similar manner as described with reference to the second shaping module 142 sequentially processing the bits of the first output data 192.

In a second illustrative implementation of the second shaping module 142, the second shaping module 142 may be configured to change bit values of the first output data 192 based on an output (e.g., a random number) of a biased random number generator (not shown). The biased random number generator may be included in or coupled to the second shaping module 142. In this implementation, the control data 188 may cause the second shaping module 142 to generate the random number (according to the threshold 194). For example, if the threshold 194 corresponds to 70% logical ones, a biased random number generator may generate the random number, where the biasing of the random number generator causes generation of 50-70% logical ones and 30-50% logical zeros (as opposed to 50% logical ones and 50% logical zeroes by an unbiased random number generator). After the random number is generated, the second shaping module 142 may XOR the random number with the first output data 192 to generate the second output data 190. Accordingly, if the first output data 192 was determined to include greater than or equal to 70% logical ones and the random number is generated to statistically include less than 70% logical zeros, XORing the first output data 192 and the random number produces the second output data 190 that includes less than 70% logical ones. The selecting module 144 may receive the second output data 190 that includes less than 70% logical ones and output the second output data 190 as the shaped data 128. In other implementations, the control data 188 may cause the second shaping module 142 to generate the random number that is output as the second output data 190. When the second output data 190 is the random number, the selecting module 144 may be configured to XOR the second output data 190 and the first output data 192 to generate the shaped data 128.

In some implementations, when the second shaping module 142 outputs the random number as the second output data 190, the second shaping module 142 may output the second output data 190 in response to the shaping circuitry 182 receiving the input data 186 and without the control data 188 being received by the shaping circuitry 182. In this implementation, the selecting module 144 may compare the first output data 192 to the threshold 194 prior to XORing the first output data 192 and the second output data 190. Alternatively, the selecting module 144 may XOR the first output data 192 and the second output data 190 without comparing the first output data 192 to the threshold 194.

During operation, the controller 130 is configured to receive the user data 160 and instructions from the accessing device 170 via the first interface 138. In a particular embodiment, the user data 160 may be part of a write operation (e.g., the controller 130 may be instructed to cause the user data 160, or a variant thereof, to be written to the memory 104). The controller 130 may provide the user data 160, or a variant thereof, to the shaper 134 (e.g., the shaping circuitry 182) as the input data 186. For example, the input data 186 may be provided to an input of the first shaping module 135.

The first shaping module 135 of the shaping circuitry 182 may apply a first shaping operation to the input data 186 to generate the first output data 192. The selection circuitry 184 (e.g., the selecting module 144) may determine a first shaping level associated with the first output data 192 and may determine whether the first shaping level satisfies (e.g., exceeds) the threshold 194. In response to the first shaping level not satisfying (e.g., does not exceed) the threshold 194, the first output data 192 may be output by the shaper 134 as the shaped data 128. Alternatively, in response to the first shaping level satisfying (e.g., exceeding) the threshold 194, the shaper 134 may perform a second shaping operation to generate the shaped data 128 that corresponds to the user data 160 (e.g., the input data 186). The shaped data 128 may have a corresponding shaping level that is less than the threshold 194.

The controller 130 may send the shaped data 128, or a variant thereof, and one or more commands to the memory device 103. The one or more commands may be associated with storing the shaped data 128 at the memory 104. For example, at least one command may include a write command to cause the memory device 103 to store the shaped data 128 to a specified address of the memory 104. For example, the shaped data 128 may be stored in the storage region 108 as the shaped data 106.

In a first example of generating the shaped data 128, the shaping circuitry 182 may be configured to apply the greedy shaping algorithm. In the first example, n may denote an index of an nth bit of data, pI may denote a first percentage of logical ones of bits 1 to n−1 of the input data 186, and pO may denote a second percentage of logical zeros of bits 1 to n−1 of the first output data 192. The first shaping module 135 may apply the first shaping operation (e.g. a first greedy shaping algorithm) to the input data 186 to generate the first output data 192. For example, for a bit n of the input data 186, the first shaping module 135 may determine a corresponding value of pI. To illustrate, for the bit n of the input data 186, if pI<50%, a bit value of bit n of the input data 186 is flipped to generate a corresponding bit n of the first output data 192. Alternatively, for the bit n of the input data 186, if pI≥50%, the bit value of bit n of the input data 186 is maintained to generate a corresponding bit n of the first output data 192. The second shaping module 142 may apply a second shaping operation (e.g., a constrained greedy shaping algorithm) to the first output data 192 to generate the second output data 190. For example, for a bit n of the first output data 192, the second shaping module 142 may determine a corresponding value of pO. To illustrate, for the bit n of the first output data 192, if pO>70%, a bit value of bit n of the first output data 192 is flipped to generate a corresponding bit n of the second output data 190. Alternatively, for the bit n of the first output data 192, if pO≤70%, the bit value of bit n of the first output data 192 is maintained to generate a corresponding bit n of the second output data 190.

In a second example of generating the shaped data 128, the shaper 134 may be configured to use a biased random number generator to generate the shaped data 128 according to the threshold 194 (e.g., the constrained shaping level). It should be noted that as used herein, a "random" number generator may include a device that generates pseudorandom numbers rather than completely random numbers. For example, various techniques described herein may utilize a linear shift feedback register (LSFR) that generates pseudo-random numbers. The configuration of a LSFR typically includes a seed value that is initially stored in the LSFR and the locations of "taps" at which feedback is extracted from the LSFR. Two LSFRs that are identically configured generate the same sequence of pseudorandom bits. Thus, when an LSFR is used to shape data during a write operation, an identically configured LSFR may be used to unshape data during a read operation. In particular implementations, the LSFR configuration used to shape data may be maintained in memory or may be generated using a known algorithm (e.g., based on a memory address of the data). To unshape the data, the LSFR configuration used to shape the data may be retrieved from the memory or may be generated using the known algorithm (e.g., based on the memory address of the data).

When a biased random generator is used, if the input data 186 is received by the shaper 134, x may denote the first output data 192, y may denote the second output data 190 (e.g., a biased random number), and z may denote the shaped data 128. The first output data 192 may be generated by performing a first shaping operation (e.g., a shaping operation that uses a greedy shaping algorithm) and the shaped data 128 may be generated as z=x XOR y. An expected shaping of (e.g., a percentage of logical zeros) of x, y, z may be denoted as p(x), p(y), p(z), respectively. The expected shaping of z may be determined by:

$$p(z)=p(x)p(y)+(1-p(x))(1-p(y)).$$

Setting p(y)=0.5 may result in p(z)=0.5, which corresponds to un-shapeable data. Setting p(y)=1 may result in p(z)=p(x), which corresponds to the original shaping achieved by the first shaping module 135 performing the first shaping operation. Values of p(y) between 0.5 and 1 may result in shaping of z between p(x) and 0.5. The second example may be applied to any shaping operation performed by the first shaping module 135 that is used to generate x.

In addition to generating the shaped data 128 and storing the shaped data 128 at the memory 104, the data storage device 102 may be configured to read the shaped data from the memory 104 and to perform a reverse shaping operation. For example, the controller 130 may receive a representation of the shaped data 128 (e.g., a representation of the shaped data 106 stored in the storage region 108). The shaper 134 may be configured to perform one or more reverse shaping operations, such as one or more un-shaping operations, to generate read data that may be provided to the accessing device 170. The read data may correspond to the input data 186 (e.g., the user data 160) received at the data storage device 102 from the accessing device 170.

In some implementations, the shaper 134 may be configured such that the first shaping module 135 and the second shaping module 142 each perform a corresponding shaping operation on the input data 186. For example, the first shaping module 135 and the second shaping module 142 may shape the input data in parallel. To illustrate, the first shaping module 135 may receive the input data 186, perform a first shaping operation to shape the input data 186 bit-by-bit, and provide a first bit-by-bit result associated with the first output data 192. Additionally, the second shaping module 142 may receive the input data 186, perform a second shaping operation to shape the input data 186 bit-by-bit, and provide a second bit-by-bit result associated with the second output data 190. The first bit-by-bit result and the second bit-by-bit result may be provided to a component that is configured to make a dynamic shaping decision to enforce the constraint shaping level. For example, the component may generate the shaped data 128 on a bit-by-bit basis by selecting a bit of the first bit-by-bit result or by selecting a bit of the second bit-by-bit result. To illustrate, for a bit position x of the input data 186, the first shaping module 135 may generate a first bit position x result and the second shaping module 142 may generate a second bit position x result. The component may receive the first bit position x result and the second bit position x result. The component may select one of the first bit position x result and the second bit position x result to be output as a value at a bit position x of the shaped data 128.

In some implementations, in addition to the component providing a selected bit as part of the shaped data 128, the component may also provide the selected bit as feedback to the first shaping module 135 and to the second shaping module 142. In some implementations, the component may be included in the selection circuitry 184 and may provide the selected bit as feedback as part of the control data 188. In a particular implementation, the component may correspond to the selecting module 144. Thus, a constrained shaper may simultaneously optimize the shaping level and follow the constraint threshold.

In some implementations, the threshold 194 may be stored at the memory 104. In other implementations, the controller 130 may include or may be coupled to a particular memory, such as a random access memory (RAM), that is configured to store the threshold 194. Alternatively, or in addition, the controller 130 may include or may be coupled to another memory (not shown), such as a non-volatile memory, a RAM, or a read only memory (ROM). The other memory may be a single memory component, multiple distinct memory components, and/or may indicate multiple different types (e.g., volatile memory and/or non-volatile) of memory components. In some embodiments, the other memory may be included in the accessing device 170.

Although one or more components of the data storage device 102 have been described with respect to the controller 130, in other implementations certain components may be included in the memory device 103 (e.g., the memory 104). For example, one or more of the shaper 134, the selection circuitry 184, the selecting module 144, the shaping circuitry 182, the first shaping module 135, or the second shaping module 142 may be included in the memory device 103. Alternatively, or in addition, one or more functions as described above with reference to the controller 130 may be performed at or by the memory device 103. For example, one or more functions of the shaper 134, the selection circuitry 184, the selecting module 144, the shaping circuitry 182, the first shaping module 135, or the second shaping module 142 may be performed by components and/or circuitry included in the memory device 103. Alternatively, or in addition, one or more components of the data storage device 102 may be included in the accessing device 170. For example, one or more of the shaper 134, the selection circuitry 184, the selecting module 144, the shaping circuitry 182, the first shaping module 135, or the second shaping module 142 may be included in the accessing device 170. Alternatively, or in addition, one or more functions as described above with reference to the controller 130 may be performed at or by the accessing device 170. As an illustrative, non-limiting example, the accessing device 170 may be configured to determine a first shaping level corresponding to applying a first shaping operation to data to be stored to the memory 104 and to perform a second shaping operation to generate shaped data that correspond to the data in response to the first shaping level exceeding a threshold. The accessing device 170 may send the shaped data to the data storage device 102 to be stored in the memory 104.

The examples illustrated with reference to FIG. 1 may enable shaped data 128 to be stored at the memory 104 to cause less memory wear. The shaped data 128 is generated in accordance with a constrained shaping level (e.g., the threshold 194). By generating the shaped data 128 in accordance with the constrained shaping level, an endurance of the memory 104 may be increased. Additionally, the constrained shaping level may reduce variability between shapeable and non-shapeable data thus reducing management overhead and improving performance. For example, the number of time tagging tables maintained when the data varies between 50%-70% logical ones is less than the number of time tagging tables maintained when the data varies between 50%-90% logical ones. Thus, constrained shaping as described with reference to FIG. 1 may reduce memory management overhead at the data storage device 102 as compared to devices storing shaped data that varies between 50%-90% logical ones.

Figure 2A:
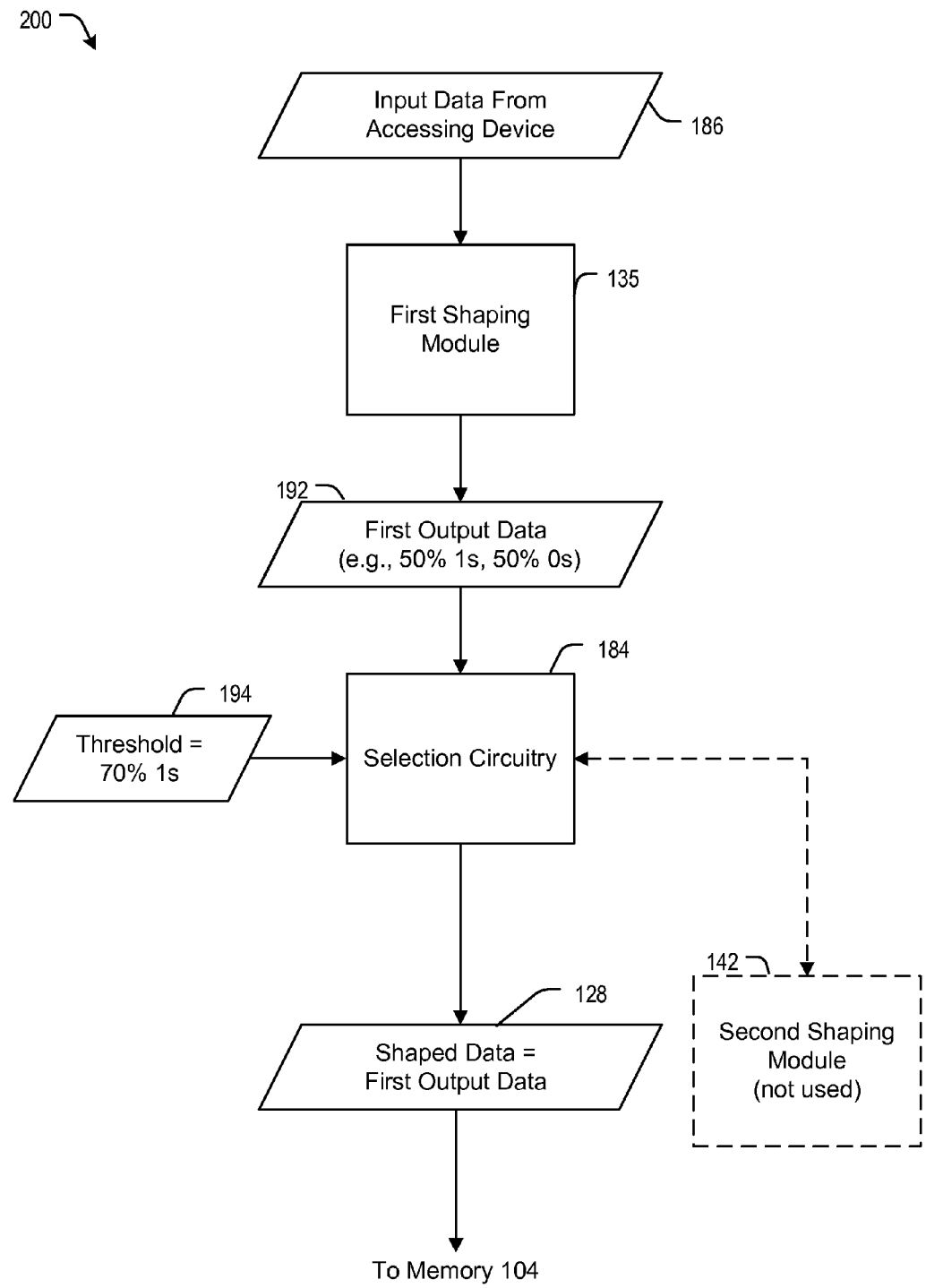
FIG. 2A is a flow diagram of a first illustrative example of generating the shaped data of FIG. 1.

Referring to FIG. 2A, a first illustrative example of generating the shaped data 128 by the shaper 134 of FIG. 1 is depicted and generally designated 200. The input data 186 from the accessing device 170 may be received at the first shaping module 135. The first shaping module 135 may be configured to apply a first shaping operation to the input data 186 to generate the first output data 192. For example, the first shaping operation may be applied to generate the first output data 192 that includes 50% logical ones and 50% logical zeros. It is noted that a uniform (50%-50%) distribution may be assumed to meet the constraint. Accordingly, when a uniform distribution is present, a second shaping operation may be omitted. If a second shaping operation is performed on a uniform distribution, the second shaping operation may fail to generate shaped data that satisfies the constraint.

The selection circuitry 184 may receive the first output data 192 and may compare the first output data 192 to the threshold 194. To illustrate, the selection circuitry 184 may determine a percentage of logical ones of the first output data 192 and may compare the percentage to the threshold 194. For example, the threshold may be associated with 70% logical ones. The selection circuitry 184 may determine that the percentage is less than or equal to the threshold 194 and may provide the first output data 192 as the shaped data 128. The shaped data 128 may be provided to the memory device 103 to be stored at the memory 104. In the first illustrative example 200, the second shaping module 142 may not be used.

Figure 2B:
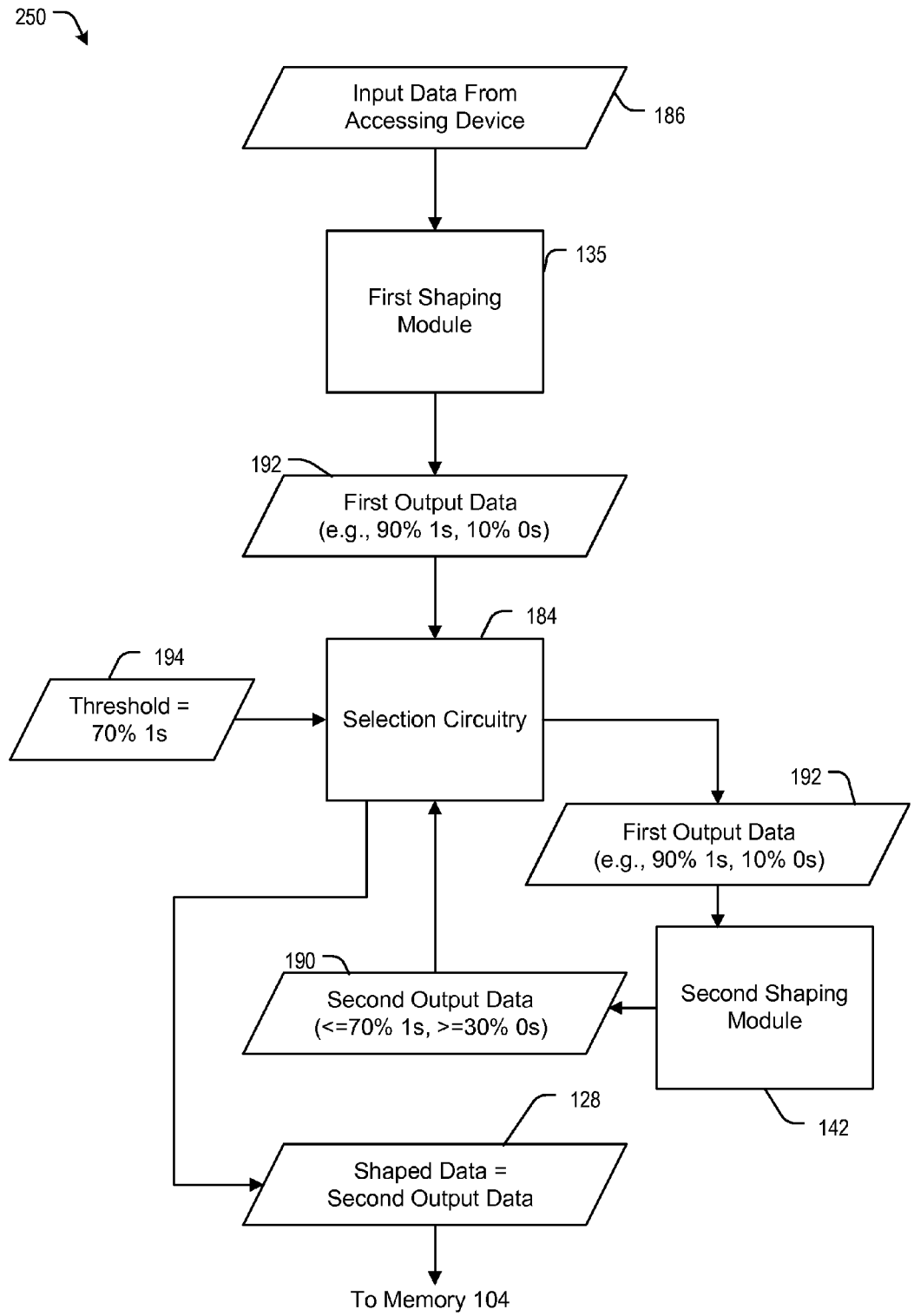
FIG. 2B is a flow diagram of a second illustrative example of generating the shaped data of FIG. 1.

Referring to FIG. 2B, a second illustrative example of generating the shaped data 128 by the shaper 134 of FIG. 1 is depicted and generally designated 250. The input data 186 from the accessing device 170 may be received at the first shaping module 135. The first shaping module 135 may be configured to apply a first shaping operation to the input data 186 to generate the first output data 192. For example, the first shaping operation may be applied to generate the first output data 192 that includes 90% logical ones and 10% logical zeros.

The selection circuitry 184 may receive the first output data 192 and may compare the first output data 192 to the threshold 194. To illustrate, the selection circuitry 184 may determine a first percentage of logical ones of the first output data 192 and may compare the first percentage to the threshold 194. For example, the threshold may be associated with 70% logical ones. The selection circuitry 184 may determine that the first percentage is greater than the threshold 194. In response to the first percentage being greater than the threshold 194, the selection circuitry 184 may provide the first output data 192 to the second shaping module.

The second shaping module 142 may be configured to apply a second shaping operation to the first output data 192 to generate the second output data 190. For example, the second shaping operation may be applied to generate the second output data 190 that includes less than or equal to 70% logical ones and greater than or equal to 30% logical zeros.

The selection circuitry 184 may receive the second output data 190 and may compare the second output data 190 to the threshold 194. To illustrate, the selection circuitry 184 may determine a second percentage of logical ones of the second output data 190 and may compare the second percentage to the threshold 194. The selection circuitry 184 may determine that the second percentage is less than or equal to the threshold 194 and may provide the second output data 190 as the shaped data 128. The shaped data 128 may be provided to the memory device 103 to be stored at the memory 104.

Figure 3:
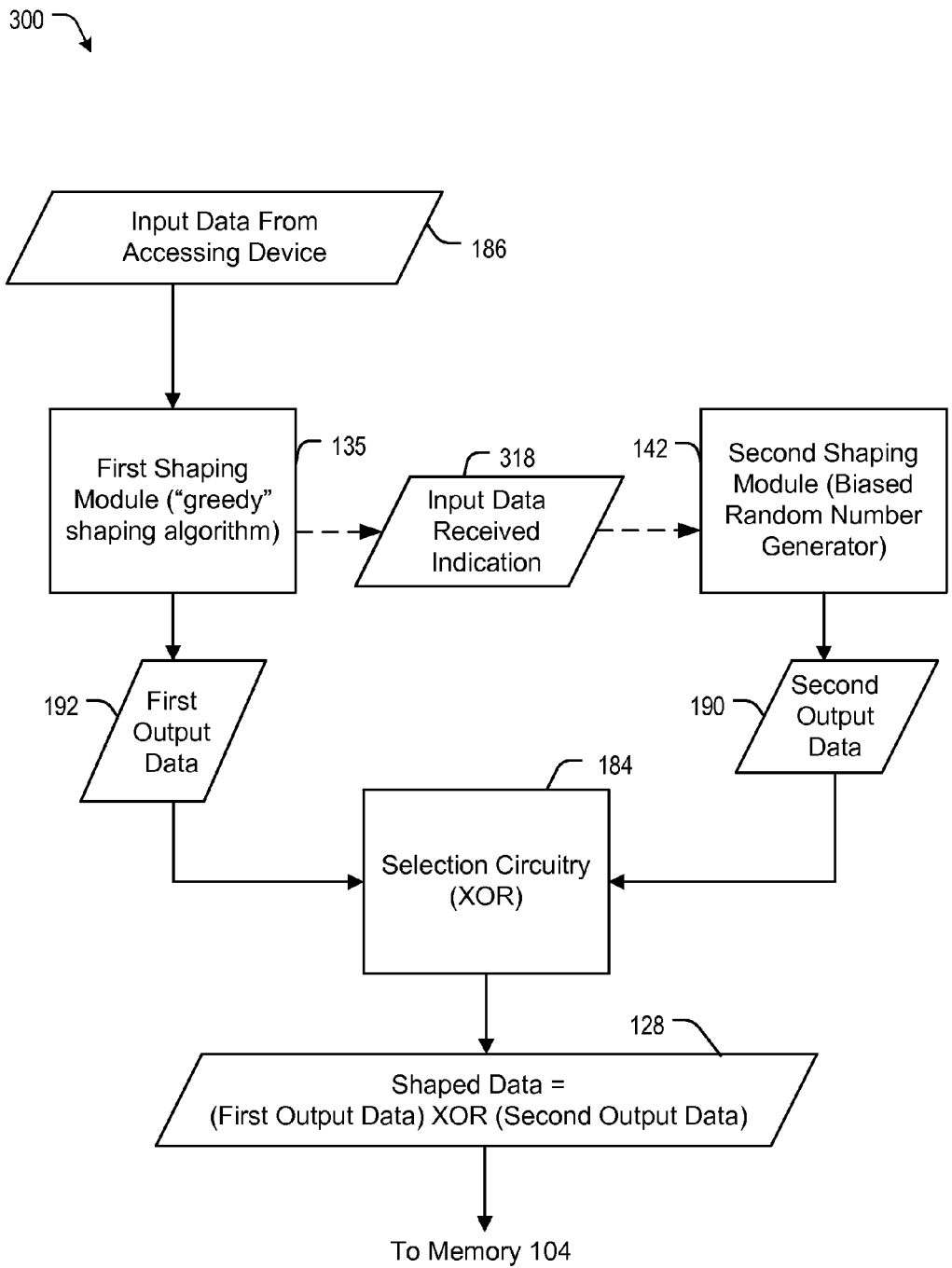
FIG. 3 is a flow diagram of a third illustrative example of generating the shaped data of FIG. 1.

Referring to FIG. 3, a third illustrative example of generating the shaped data 128 by the shaper 134 of FIG. 1 is depicted and generally designated 300. The input data 186 from the accessing device 170 may be received at the first shaping module 135. The first shaping module 135 may be configured to apply a first shaping operation to the input data 186 to generate the first output data 192. In some implementations, the first shaping operation may be associated with a greedy shaping algorithm.

In response to the input data 186 being received by the shaper 134 (e.g., the first shaping module 135), an input data received indication 318 may be received at the second shaping module 142. As an illustrative, non-limiting example, the input data received indication 318 may be received from the first shaping module 135. Responsive to the input data received indication 318, the second shaping module 142 may generate the second output data 190. For example, the second shaping module 142 may include biased random number generator which may generate a random number that is output as the second output data 190.

The selection circuitry 184 may receive the first output data 192 and the second output data 190. The selection circuitry 184 may be configured to perform an XOR operation using the first output data 192 and the second output data 190. A result of the XOR operation may be provided to the memory device 103 to be stored at the memory 104.

Figure 4:
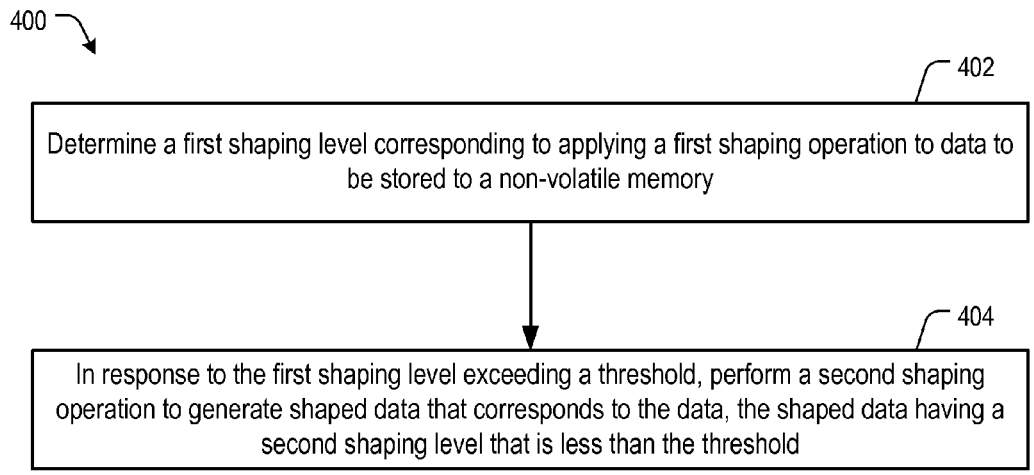
FIG. 4 is a flow diagram that illustrates a particular example of a method of generating shaped data.

Referring to FIG. 4, a particular illustrative example of a method is depicted and generally designated 400. The method 400 may be performed at the data storage device 102, such as the shaper 134, the accessing device 170 of FIG. 1, or a combination thereof, as illustrative, non-limiting examples.

The method 400 includes determining a first shaping level corresponding to applying a first shaping operation to data to be stored to a non-volatile memory, at 402. For example, the first shaping level corresponds to a count of the bits having the first bit value as compared to a total number of bits of the output data. The non-volatile memory may include or correspond to the memory 104. In some implementations, the non-volatile memory may include a flash memory. Additionally or alternatively, the non-volatile memory includes a three-dimensional (3D) memory configuration that is monolithically formed in one or more physical levels of arrays of storage elements having an active area disposed above a silicon substrate. The non-volatile memory may be coupled to circuitry associated with operation of the storage elements.

The first shaping operation may be configured to generate output data having a larger number of bits having a first bit value than bits having a second bit value. In some implementations, the first shaping operation may be configured to sequentially process bits of the data and to generate the output data by selectively changing a bit value of each particular bit of the data based on a count of processed bits that have a particular bit value.

The method 400 also includes, in response to the first shaping level exceeding a threshold, performing a second shaping operation to generate shaped data that correspond to the data, at 404. The shaped data may have a second shaping level that is less than or equal to the threshold. The threshold may include or correspond to the threshold 194 of FIG. 1. The shaped data may be stored at the non-volatile memory of the data storage device.

In some implementations, the second shaping operation is configured to selectively change bit values of the output data based on an output of a biased random number generator. In other implementations, the second shaping operation may be configured to sequentially process bits of the output data and to selectively change a bit value of each particular output bit in the output data based on a count of processed output bits that have a particular bit value. The count of processed output bits corresponds to a count of the processed output bits that have the particular bit value within a sliding window that includes, for a particular output bit, a particular number of the processed output bits that sequentially precede the particular output bit.

By generating the shaped data to have the second shaping level that is less than or equal to the threshold, an endurance of the non-volatile memory may be increased. Additionally, the shaped data having the second shaping level that is less than or equal to the threshold may enable the data storage device to maintain small memory management table(s), such as time tagging table(s).

Figure 5:
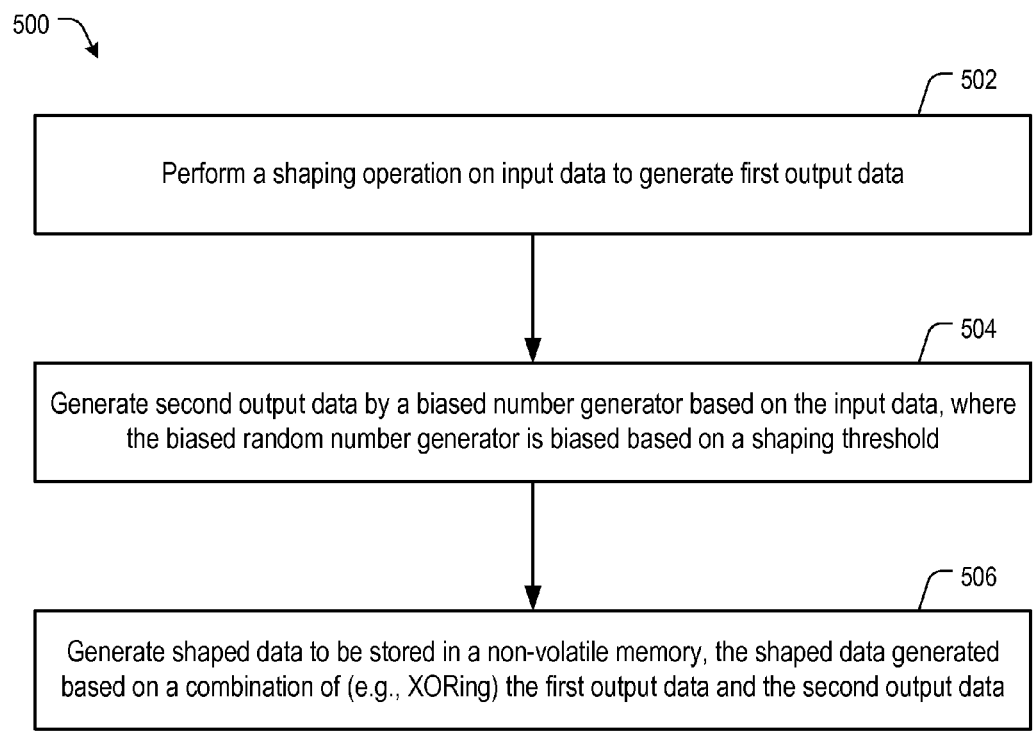
FIG. 5 is a flow diagram that illustrates another particular example of a method of generating shaped data.

Referring to FIG. 5, a particular illustrative example of a method is depicted and generally designated 500. The method 500 may be performed at the data storage device 102, such as the shaper 134, the accessing device 170 of FIG. 1, or a combination thereof, as illustrative, non-limiting examples.

The method 500 includes performing a shaping operation on input data to generate first output data, at 502. The input data may include or correspond to the input data 186 of FIG. 1

The method 500 also includes generating second output data by a biased number generator based on the input data, at 504. For example, the biased random number generator may include or correspond to the second shaping module 142 of FIG. 1. The biased random number generator may be biased based on a shaping threshold (e.g., a constrained shaping level). The shaping threshold may include or correspond to the threshold 194 of FIG. 1. Accordingly, a statistical percentage of logical ones included in the second output data may satisfy the shaping threshold.

The method 500 also includes generating shaped data to be stored in a non-volatile memory, at 506. The non-volatile memory may include or correspond to the memory 104. The shaped data may be generated based on a combination of the first output data and the second output data. For example, the combination may be generated by XORing the first output data and the second output data. XORing the first output data and the second output data may generate the shaped data that includes a percentage of logical ones that satisfies the shaping threshold.

By generating the shaped data to be stored at the non-volatile memory, less memory wear may be caused at the non-volatile memory as compared to storing an unshaped version of the shaped data. The shaped data may be generated in accordance with (and to satisfy) the shaping threshold (i.e., a constrained shaping level).

The method 400 of FIG. 4 and/or the method 500 of FIG. 5 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 400 of FIG. 4 and/or the method 500 of FIG. 5 can be initiated or controlled by one or more processors, such as one or more processors included in or coupled to a controller or a memory of a non-volatile memory system, a storage controller, the data storage device 102, and/or the accessing device 170 of FIG. 1. A controller configured to perform the method 400 of FIG. 4 and/or the method 500 of FIG. 5 may be able to shape data according to a constrained shaping level. As an example, one or more of the methods of FIGS. 4-5, individually or in combination, may be performed by the controller 130 of FIG. 1. To illustrate, a portion of one of the methods FIGS. 4-5 may be combined with a second portion of one of the methods of FIGS. 4-5. Additionally, one or more operations described with reference to the FIGS. 4-5 may be optional, may be performed at least partially concurrently, and/or may be performed in a different order than shown or described.

In an illustrative example, a processor, such as a processor of the data storage device 102, may be programmed to determine a first shaping level corresponding to applying a first shaping operation to data to be stored to a non-volatile memory. The processor may further execute instructions to, in response to the first shaping level exceeding a threshold, initiate performance of a second shaping operation to generate shaped data that corresponds to the data. The shaped data may have a second shaping level that is less than the threshold.

In another illustrative example, a processor, such as a processor of the data storage device 102, may be programmed to initiate performance of a shaping operation on input data to generate first output data. The processor may further execute instructions to initiate generation of second output data by a biased number generator based on the input data. The biased random number generator may be biased based on a shaping threshold. The processor may further execute instructions to initiate generation shaped data to be stored in a non-volatile memory. The shaped data may be generated based on a combination of the first output data and the second output data.

Figure 6A:
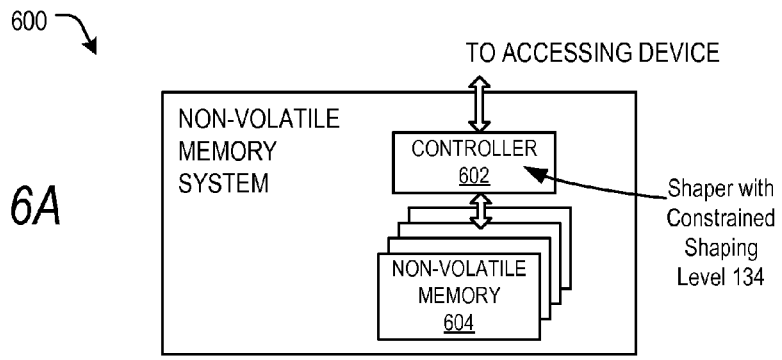
FIG. 6A is a block diagram of an illustrative example of a non-volatile memory system including a controller that includes a shaper associated with a constrained shaping level.

Additional examples of systems and devices suitable for use in implementing aspects of the disclosure are shown in FIGS. 6A-6C and FIGS. 7A-7B. FIG. 6A is a block diagram illustrating a non-volatile memory system 600 according to an aspect of the subject matter described herein. Referring to FIG. 6A, the non-volatile memory system 600 includes a controller 602 and non-volatile memory that may be made up of one or more non-volatile memory dies, including an illustrative non-volatile memory die 604. A "memory die" may refer to a collection of non-volatile memory cells, and associated circuitry for managing the physical operation of those non-volatile memory cells, that are formed on a single semiconductor substrate. The controller 602 interfaces with an accessing system, such as a host system, and transmits command sequences for read, program, and erase operations to non-volatile memory dies, such as the illustrative non-volatile memory die 604.

The controller 602 may include the shaper 134 that is configured to shape data bits in accordance with a constrained shaping level. For example, the shaper 134 may receive input data from the accessing system for storage in the non-volatile memory die 604. In a particular non-limiting example in which the non-volatile memory die 604 corresponds to NAND flash memory, the shaper 134 may shape data bits to be stored in the NAND flash memory such that a ratio of logical ones to logical zeros in the shaped data bits falls within a threshold range (e.g., 50%-70% logical ones). The threshold range of logical ones may be selected to increase endurance of the NAND flash memory while maintaining small memory management table(s), such as time tagging table(s), at the non-volatile memory system 600.

The controller 602 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and/or an embedded microcontroller, as illustrative, non-limiting examples. The controller 602 can be configured with hardware and/or firmware to perform the various functions described below and shown in the flow diagrams. Also, some of the components shown as being internal to the controller 602 can be stored external to the controller 602, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with an accessing device, such as a computer or electronic device. A flash memory controller can have additional functionality other than the specific functionality described herein. For example, the flash memory controller can format a flash memory so that the flash memory is operating properly, map out bad flash memory cells, and allocate spare cells to be substituted for future failed cells. Some part of the spare cells can be used to hold firmware to operate the flash memory controller and implement other features. In operation, an accessing device communicates with the flash memory controller to read data from or write data to the flash memory. If the accessing device provides a logical address to which data is to be read/written, the flash memory controller can convert the logical address received from the accessing device to a physical address in the flash memory. In an alternative implementation, the accessing device can provide the physical address to the flash memory controller. The flash memory controller can also perform various memory management functions, such as, but not limited to, wear leveling (distributing writes to avoid wearing out specific blocks of memory that would otherwise be repeatedly written to) and/or garbage collection (after a block is full, moving only the valid pages of data to a new block, so the full block can be erased and reused), as illustrative, non-limiting examples.

The non-volatile memory die 604 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 602 and the non-volatile memory die 604 may be any suitable interface, such as a Toggle Mode interface. In some implementations, non-volatile memory system 600 may be a card based system, such as a secure digital (SD) or a micro secure digital (micro-SD) card. Alternatively, in other implementations, the non-volatile memory system 600 may be part of an embedded memory system.

Although, in the example illustrated in FIG. 6A, the non-volatile memory system 600 (sometimes referred to herein as a storage module) includes a single channel between the controller 602 and the non-volatile memory die 604, the subject matter described herein is not limited to having a single memory channel. For example, in some NAND memory system architectures (such as the ones shown in FIGS. 6B and 6C), two, four, eight or more NAND channels may be present between the controller and the NAND memory device, depending on controller capabilities. In any of the examples described herein, more than a single channel may be present between the controller 602 and the non-volatile memory die 604, even if a single channel is shown in the drawings.

Figure 6B:
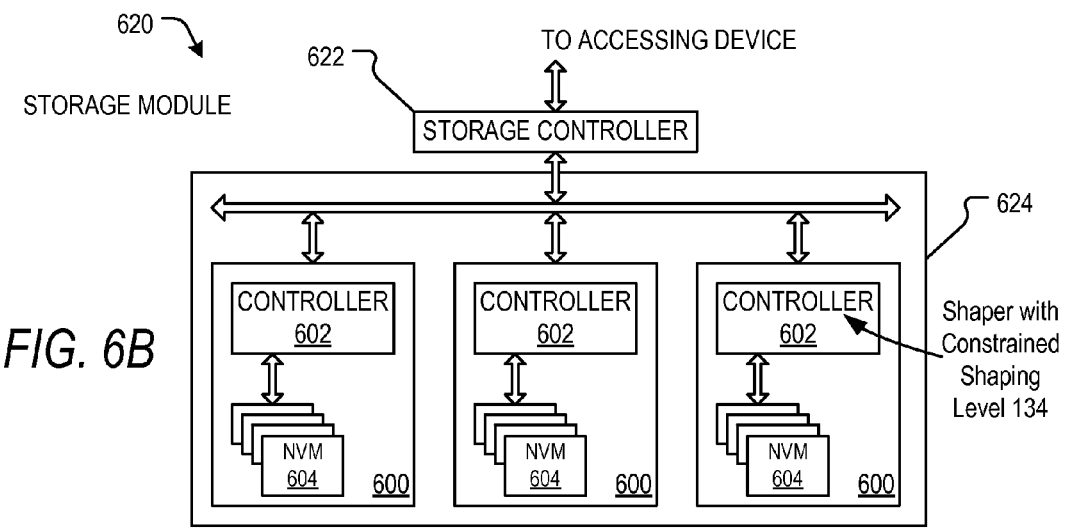
FIG. 6B is a block diagram of an illustrative example of a storage module that includes plural non-volatile memory systems that each may include a controller having a shaper associated with a constrained shaping level.

FIG. 6B illustrates a storage module 620 that includes a plurality of the non-volatile memory systems 600. As such, the storage module 620 may include a storage controller 622 that interfaces with an accessing device and with a storage system 624, which includes the plurality of the non-volatile memory systems 600. The interface between the storage controller 622 and the non-volatile memory systems 600 may be a bus interface, such as a serial advanced technology attachment (SATA) or a peripheral component interface express (PCIe) interface. In some implementations, the storage module 620 may be a solid state drive (SSD) which may be found in portable computing devices, such as laptop computers and tablet computers, as illustrative, non-limiting examples. Each storage controller 602 of FIG. 6B may include a shaper, such as the shaper 134. Alternatively or in addition, the storage controller 622 may include a shaper corresponding to the shaper 134.

Figure 6C:
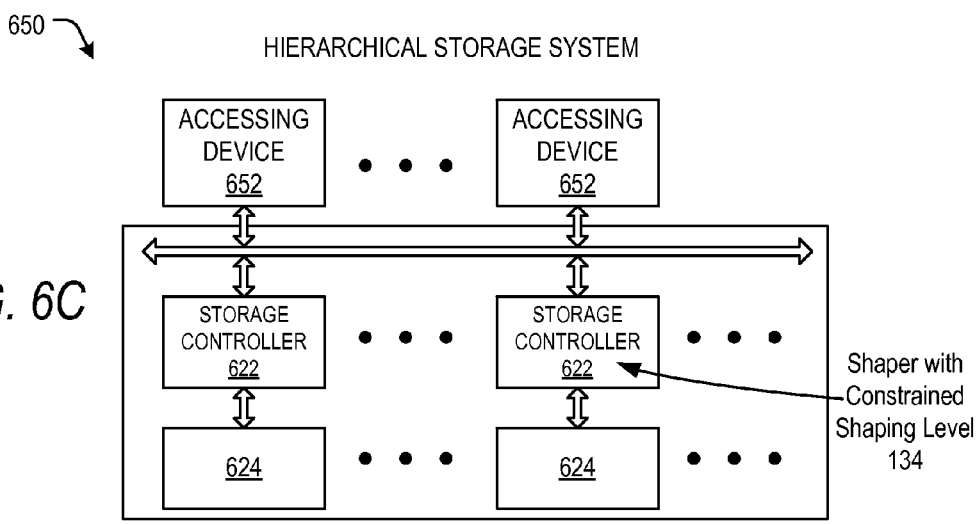
FIG. 6C is a block diagram of an illustrative example of a hierarchical storage system that includes a plurality of storage controllers that each may include a shaper associated with a constrained shaping level.

FIG. 6C is a block diagram illustrating a hierarchical storage system 650 that includes a plurality of the storage controllers 622, each of which controls a respective storage system 624. Accessing device systems 652 may access memories within the hierarchical storage system 650 via a bus interface. The bus interface may be a non-volatile memory (NVM) express (NVMe) or a fiber channel over Ethernet (FCoE) interface, as illustrative, non-limiting examples. In some implementations, the hierarchical storage system 650 illustrated in FIG. 6C may be a rack mountable mass storage system that is accessible by multiple accessing devices (e.g., host computers), such as would be found in a data center or other location where mass storage is needed. Each storage controller 622 of FIG. 6B may include a shaper, such as the shaper 134.

Figure 7A:
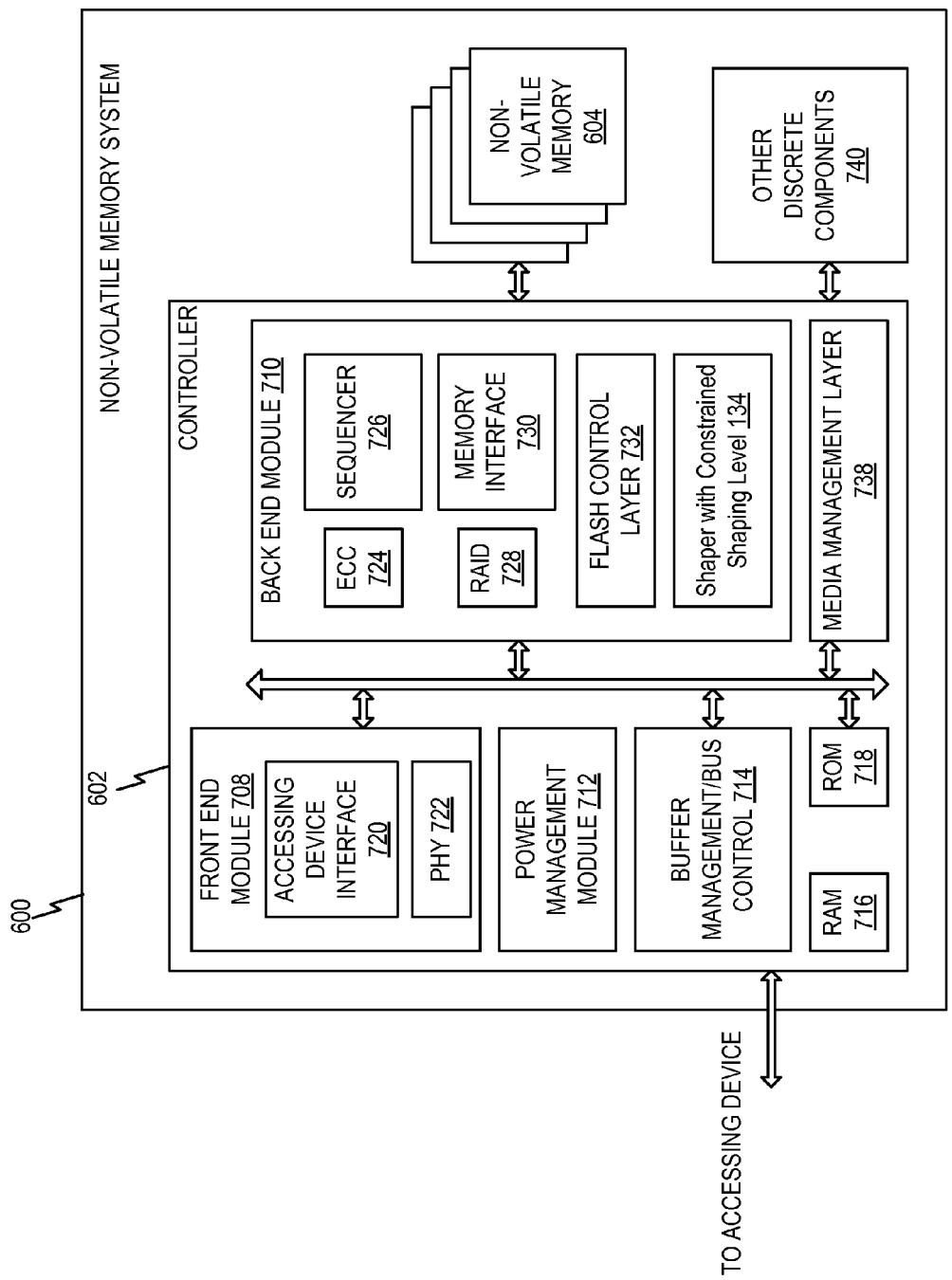
FIG. 7A is a block diagram of an illustrative example of a non-volatile memory system including a controller that may include a shaper associated with a constrained shaping level.

FIG. 7A is a block diagram illustrating exemplary components of the controller 602 in more detail. The controller 602 includes a front end module 708 that interfaces with an accessing device, a back end module 710 that interfaces with non-volatile memory dies (e.g., including the non-volatile memory die 604), and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 602, a buffer management/bus controller 714 manages buffers in a random access memory (RAM) 716 and controls internal bus arbitration of the controller 602. A read only memory (ROM) 718 stores system boot code. Although illustrated in FIG. 7A as located within the controller 602, in other implementations, one or both of the RAM 716 and the ROM 718 may be located externally to the controller 602. In other implementations, portions of the RAM 716 and/or the ROM 718 may be located both within the controller 602 and outside the controller 602.

The front end module 708 includes an accessing device interface 720 and a physical layer interface (PHY) 722 that provide an electrical interface with the accessing device or a next level storage controller. A type of accessing device interface 720 can depend on the type of memory being used. Examples of accessing device interface 720 include, but are not limited to, serial advanced technology attachment (SATA), SATA Express, serial attached small computer system interface (SAS), Fibre Channel, universal serial bus (USB), peripheral component interconnect express (PCIe), and NVMe. The accessing device interface 720 typically facilitates transfer for data, control signals, and timing signals, as illustrative, non-limiting examples.

The back end module 710 includes an error correction code (ECC) engine 724 that encodes data, such as data bytes, received from the accessing device, and decodes and error corrects representations of the data (e.g., representations of the data bytes) read from non-volatile memory, such as the non-volatile memory die 604. The back end module 710 may also include the shaper 134. A command sequencer 726 may generate command sequences, such as program and erase command sequences, to be transmitted to the non-volatile memory die 604. A redundant array of independent drives (RAID) module 728 manages generation of RAID parity and recovery of failed data. The RAID parity may be used as an additional level of integrity protection for the data being written into the non-volatile memory die 604. In some cases, the RAID module 728 may be a part of the ECC engine 724. A memory interface 730 provides the command sequences to the non-volatile memory die 604 and receives status information from the non-volatile memory die 604. In some implementations, the memory interface 730 may be a double data rate (DDR) interface, such as a Toggle Mode interface. A flash control layer 732 controls the overall operation of back end module 710.

Additional components of the non-volatile memory system 600 illustrated in FIG. 7A include a power management module 712 and a media management layer 738, which performs wear leveling of memory cells of the non-volatile memory die 604. The non-volatile memory system 600 also includes other discrete components 740, such as external electrical interfaces, external RAM, resistors, capacitors, or other components that may interface with the controller 602. In some implementations, one or more of the physical layer interface 722, the RAID module 728, the media management layer 738, and/or the buffer management/bus controller 714 are optional components that may be omitted from the controller 602.

Figure 7B:
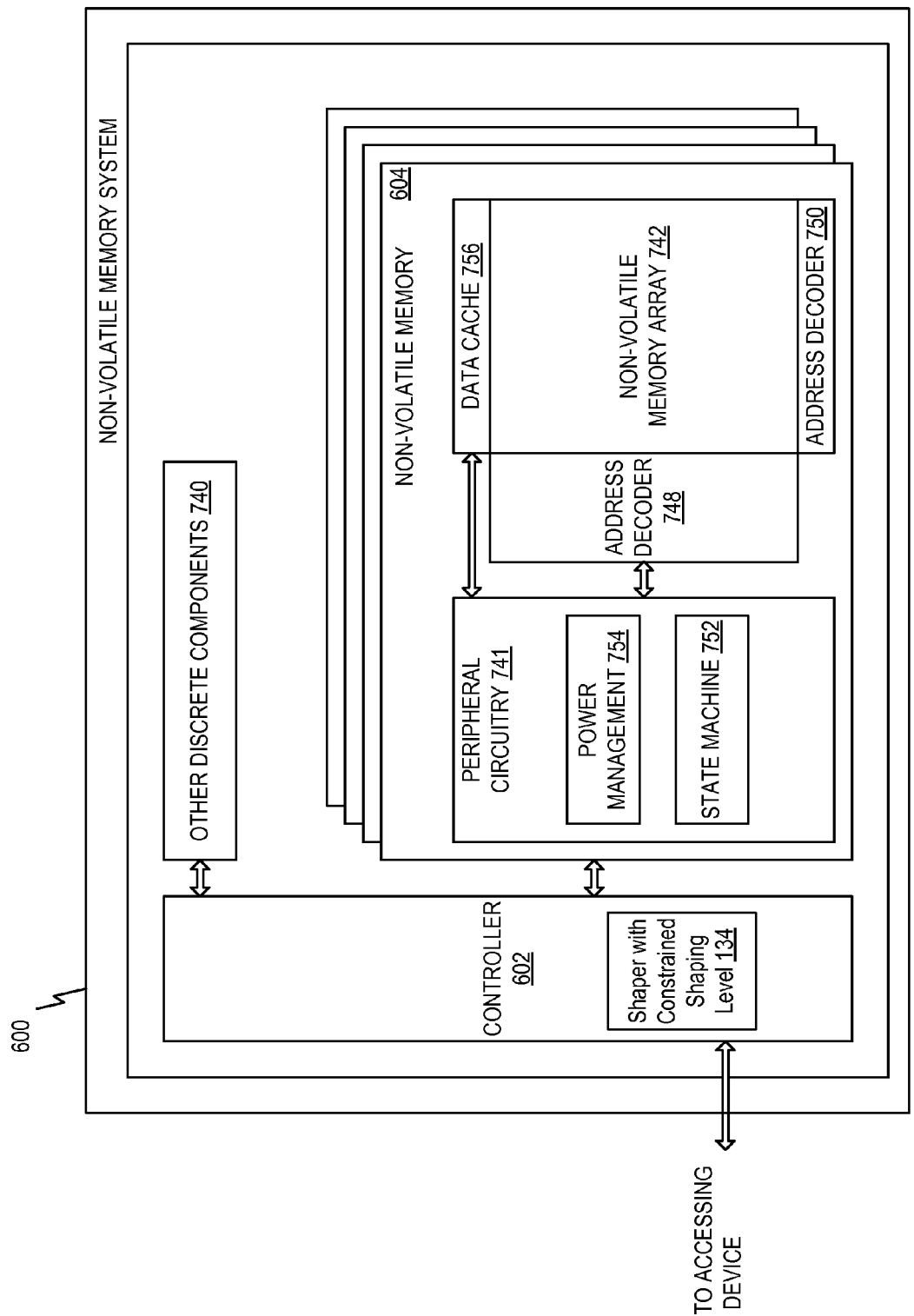
FIG. 7B is a block diagram of an illustrative example of a non-volatile memory die that may be coupled to a controller that includes a shaper associated with a constrained shaping level.

FIG. 7B is a block diagram illustrating exemplary components of the non-volatile memory die 604 in more detail. The non-volatile memory die 604 includes peripheral circuitry 741 and a non-volatile memory array 742. The non-volatile memory array 742 includes non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 741 includes a power management module 754 and a state machine 752 that provides status information to the controller 602. The controller 602 may also include the shaper 134. The non-volatile memory die 604 further includes discrete components 740, an address decoder 748, an address decoder 750, and a data cache 756 that caches data.

Although various components of the non-volatile memory system 600 of FIG. 6A, the storage module 620 of FIG. 6B, the hierarchical storage system 650 of FIG. 6C, the data storage device 102, such as the shaper 134, and/or the accessing device 170 of FIG. 1 are depicted herein as block components and described in general terms, such components may include one or more physical components, such as hardware controllers, one or more microprocessors, state machines, logic circuits, one or more other structures, other circuits, or a combination thereof configured to enable the various components to perform operations described herein.

Components described herein may be operationally coupled to one another using one or more nodes, one or more buses (e.g., data buses and/or control buses), one or more other structures, or a combination thereof. One or more aspects of the various components may be implemented using a microprocessor or microcontroller programmed to perform operations described herein, such as one or more operations of the method the method 400 of FIG. 4 and/or the method 500 of FIG. 5.

Alternatively or in addition, one or more aspects of the non-volatile memory system 600 of FIG. 6A, the storage module 620 of FIG. 6B, the hierarchical storage system 650 of FIG. 6C, the data storage device 102, such as the shaper 134, and/or the accessing device 170 of FIG. 1 may be implemented using a microprocessor or microcontroller programmed (e.g., by executing instructions) to perform operations described herein, such as one or more operations of the method 400 of FIG. 4 and/or one or more operations of the method 500 of FIG. 5, as described further herein. As an illustrative, non-limiting example, the non-volatile memory system 600 includes a processor executing instructions (e.g., firmware) retrieved from the non-volatile memory die 604. Alternatively or in addition, instructions that are executed by the processor may be retrieved from a separate memory location that is not part of the non-volatile memory die 604, such as at a read-only memory (ROM).

In some implementations, each of the controller 130, the memory device 103, the accessing device 170 of FIG. 1, the controller 602, the non-volatile memory 604 of FIG. 6A, the storage controller 222 of FIG. 6B, and/or the accessing device 652 of FIG. 6C may include a processor executing instructions that are stored at a memory, such as a non-volatile memory of the data storage device 102, the accessing device 170 of FIG. 1, the non-volatile memory system 600 of FIG. 6A, the storage module 620 of FIG. 6B, or the accessing device 652 of FIG. 6C. Alternatively or additionally, executable instructions that are executed by the processor may be stored at a separate memory location that is not part of the non-volatile memory, such as at a read-only memory (ROM) of the data storage device 102, the accessing device 170 of FIG. 1, the non-volatile memory system 600 of FIG. 6A, the storage module 620 of FIG. 6B, or the accessing device 652 of FIG. 6C.

The data storage device 102 of FIG. 1, the non-volatile memory system 600 of FIG. 6A, or the storage module 620 of FIG. 6B may be attached to or embedded within one or more accessing devices, such as within a housing of the accessing device 170 of FIG. 1 or the accessing device 652 of FIG. 6C. For example, the data storage device 102 of FIG. 1, the non-volatile memory system 600 of FIG. 6A, or the storage module 620 of FIG. 6B may be embedded within the accessing device 170 of FIG. 1 or the accessing device 652 of FIG. 6C in accordance with a Joint Electron Devices Engineering Council (JEDEC) Solid State Technology Association Universal Flash Storage (UFS) configuration. To further illustrate, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory. However, in other embodiments, the data storage device 102 of FIG. 1, the non-volatile memory system 600 of FIG. 6A, or the storage module 620 of FIG. 6B may be implemented in a portable device configured to be selectively coupled to one or more external accessing devices. For example, the data storage device 102 of FIG. 1, the non-volatile memory system 600 of FIG. 6A, or the storage module 620 of FIG. 6B may be removable from the accessing device 170 of FIG. 1 or the accessing device 652 of FIG. 6C (i.e., "removably" coupled to the accessing device 170 of FIG. 1 or the accessing device 652 of FIG. 6C). As an example, the data storage device 102 may be removably coupled to the accessing device 170 of FIG. 1 or the accessing device 652 of FIG. 6C in accordance with a removable universal serial bus (USB) configuration. In still other embodiments, the data storage device 102 of FIG. 1, the non-volatile memory system 600 of FIG. 6A, or the storage module 620 of FIG. 6B may be a component (e.g., a solid-state drive (SSD)) of a network accessible data storage system, such as an enterprise data system, a network-attached storage system, a cloud data storage system, etc.

The memory 104, the memory device 103 (e.g., the memory 104) of FIG. 1, the non-volatile memory 604 of FIG. 6A, the RAM 716, the ROM 718 of FIG. 7A, and/or the non-volatile memory array 742 of FIG. 7B may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 may include another type of memory. The memory 104, the memory device 103 (e.g., the memory 104) of FIG. 1, the non-volatile memory 604 of FIG. 6A, the RAM 716, the ROM 718 of FIG. 7A, and/or the non-volatile memory array 742 of FIG. 7B may include a semiconductor memory device.

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
    a non-volatile memory; and
    a controller coupled to the non-volatile memory, the controller configured to:
        determine a first shaping level corresponding to applying a first shaping operation to data to be stored to the non-volatile memory; and
        in response to the first shaping level exceeding a threshold, perform a second shaping operation to generate shaped data that corresponds to the data, the shaped data having a second shaping level that is less than the threshold.

2. The data storage device of claim 1, wherein the first shaping operation is configured to generate output data having a larger number of bits having a first bit value than bits having a second bit value.

3. The data storage device of claim 2, wherein the first shaping level corresponds to a count of the bits having the first bit value as compared to a total number of bits of the output data.

4. The data storage device of claim 2, wherein the first shaping operation is configured to sequentially process bits of the data and to generate the output data by selectively changing a bit value of each particular bit of the data based on a count of processed bits that have a particular bit value.

5. The data storage device of claim 2, wherein the second shaping operation is configured to sequentially process bits of the output data and to selectively change a bit value of each particular output bit in the output data based on a count of processed output bits that have a particular bit value.

6. The data storage device of claim 5, wherein the count of processed output bits corresponds to a count of the processed output bits that have the particular bit value within a sliding window that includes, for a particular output bit, a particular number of the processed output bits that sequentially precede the particular output bit.

7. The data storage device of claim 2, wherein the second shaping operation is configured to selectively change bit values of the output data based on an output of a biased random number generator.

8. The data storage device of claim 1, wherein the non-volatile memory includes a flash memory.

9. The data storage device of claim 1, wherein the non-volatile memory includes a three-dimensional (3D) memory configuration that is monolithically formed in one or more physical levels of arrays of storage elements having an active area disposed above a silicon substrate, and further comprising circuitry associated with operation of the storage elements.

10. A method comprising:
   at a data storage device including a non-volatile memory and a controller coupled to the non-volatile memory, performing:
      determining a first shaping level corresponding to applying a first shaping operation to data to be stored to the non-volatile memory; and
      in response to the first shaping level exceeding a threshold, performing a second shaping operation to generate shaped data that corresponds to the data, the shaped data having a second shaping level that is less than the threshold.

11. The method of claim 10, wherein the first shaping operation is configured to generate output data having a larger number of bits having a first bit value than bits having a second bit value.

12. The method of claim 11, wherein the first shaping level corresponds to a count of the bits having the first bit value as compared to a total number of bits of the output data.

13. The method of claim 11, wherein the first shaping operation is configured to sequentially process bits of the data and to generate the output data by selectively changing a bit value of each particular bit of the data based on a count of processed bits that have a particular bit value.

14. The method of claim 11, wherein the second shaping operation is configured to sequentially process bits of the output data and to selectively change a bit value of each particular output bit in the output data based on a count of processed output bits that have a particular bit value.

15. The method of claim 14, wherein the count of processed output bits corresponds to a count of the processed output bits that have the particular bit value within a sliding window that includes, for a particular output bit, a particular number of the processed output bits that sequentially precede the particular output bit.

16. The method of claim 11, wherein the second shaping operation is configured to selectively change bit values of the output data based on an output of a biased random number generator.

17. A data storage device comprising:
   a non-volatile memory;
   a first shaping module configured to perform a first shaping operation on first input data to generate first output data that has a larger number of bits having a first bit value than bits having a second bit value;
   a second shaping module configured to perform a second shaping operation on second input data to generate second output data that has a larger number of bits having the first bit value than bits having the second bit value; and
   selection logic configured to select the first output data or the second output data to be stored in the non-volatile memory based on whether a first shaping level of the first output data satisfies a threshold,
   wherein the second shaping operation includes constraining a second shaping level of the second output data to satisfy the threshold.

18. The data storage device of claim 17, wherein the first shaping level corresponds to a count of the bits of the first output data having the first bit value as compared to a total number of bits of the first output data.

19. The data storage device of claim 17, wherein the first shaping operation is configured to sequentially process bits of the first input data and to generate the first output data by selectively changing a bit value of each particular bit of the first input data based on a count of processed bits that have a particular bit value.

20. The data storage device of claim 17, further comprising a controller that includes the first shaping module, the second shaping module, and the selection logic, wherein the controller is configured to receive data to be stored to the non-volatile memory and to provide the data to an input of the first shaping module, and wherein the selection logic is further configured to provide the first output data to an input of the second shaping module in response to the first shaping level not satisfying the threshold.

21. The data storage device of claim 20, wherein the second shaping operation is configured to sequentially process bits of the first output data and to selectively change a bit value of each particular output bit in the second output data based on a count of processed output bits that have a particular bit value.

* * * * *